United States Patent
Torre et al.

(10) Patent No.: US 6,748,028 B1
(45) Date of Patent: Jun. 8, 2004

(54) DIGITAL AM DEMODULATOR, PARTICULARLY FOR DEMODULATING TV SIGNALS

(75) Inventors: Luigi Della Torre, Lissone (IT); Marco Ronchi, Cavenago Brianza (IT); Andrea Vitali, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/571,965

(22) Filed: May 16, 2000

(30) Foreign Application Priority Data

May 31, 1999 (EP) .............................. 99830330

(51) Int. Cl.[7] ............................................... H03D 1/24
(52) U.S. Cl. ...................................... 375/320; 455/255
(58) Field of Search ................................ 375/268, 270, 375/320, 321, 340; 455/203, 204, 255, 256, 258, 259, 318, 319; 329/358, 359, 360

(56) References Cited

U.S. PATENT DOCUMENTS

| | | | |
|---|---|---|---|
| 4,759,079 A | * 7/1988 | Ichikawa | 455/202 |
| 5,479,136 A | * 12/1995 | Endo et al. | 331/2 |
| 5,694,419 A | 12/1997 | Lawrence et al. | 375/222 |
| 5,731,848 A | 3/1998 | Patel et al. | 348/614 |
| 5,809,088 A | 9/1998 | Han | 375/344 |
| 6,073,000 A | * 6/2000 | Shinohara | 455/310 |

FOREIGN PATENT DOCUMENTS

| | | | |
|---|---|---|---|
| DE | 4444870 | 12/1994 | H03H/17/06 |
| DE | 19538935 | 10/1995 | H03D/1/00 |
| DE | 19720766 | 5/1997 | H03D/1/00 |
| EP | 0683609 | 4/1995 | H04N/5/455 |
| EP | 0769873 | 4/1997 | H04N/5/46 |
| FR | 2765429 | 5/1998 | H04L/27/06 |
| WO | WO 98/12836 | 3/1998 | H04L/7/02 |

* cited by examiner

*Primary Examiner*—Stephen Chin
*Assistant Examiner*—Kevin Kim
(74) *Attorney, Agent, or Firm*—Lisa K. Jorgenson; Allen, Dyer, Doppelt, Milbrath & Gilchrist, P.A.

(57) ABSTRACT

A digital AM demodulator, particularly for demodulating an input signal originating from a tuner, includes a first carrier generator for generating a first carrier signal which is not correlated with the input signal, and a multiplier for multiplying the first carrier signal by the input signal. Filters are arranged upstream and downstream of the multiplier for filtering undesired signals. The digital AM demodulator further includes a circuit for detecting a phase shift between a frequency of the input signal and a frequency of a local carrier signal. A correlation circuit correlates the first carrier signal with the input signal. The first carrier signal and the local carrier signal are mutually correlated, whereas the local carrier signal is not correlated with the input signal.

46 Claims, 4 Drawing Sheets

DIGITAL AM DEMODULATOR, PARTICULARLY FOR DEMODULATING TV SIGNALS

FIELD OF THE INVENTION

The present invention relates to a digital AM demodulator, and, more particularly, to a high-frequency digital AM demodulator adapted for demodulating TV signals in PAL-NTSC-SECAM formats, which can be integrated in a digital video processing unit. The digital AM demodulator starts with a medium-frequency sampled signal, such as a signal originating from a tuner.

BACKGROUND OF THE INVENTION

To demodulate a TV signal starting from a medium-frequency sampled signal originating from a tuner, for example, an analog demodulator is positioned downstream from the tuner. The output is a signal that is demodulated in an audio demodulator to obtain an audio signal, and a video signal that is split into a luminance signal and a chrominance signal.

We now consider a known AM demodulator, a block diagram of which is shown in FIG. 1. The demodulator is formed by an input filter 1 and by a low-pass filter 2 arranged in a cascade configuration. The input filter 1 is fed with an input signal and the output signal therefrom is fed to a multiplier 3, which in turn receives a local carrier signal.

Assuming, therefore, that a local carrier designated by the term "carrier" is available, whose value is $$\text{carrier} = 2\cos(\omega_a t + \psi),$$

and according to trigonometric addition and subtraction formulas $$\cos(\alpha) + \cos(\beta) = \cos\frac{(\alpha+\beta)}{2} \cdot \cos\frac{(\alpha+\beta)}{2}$$

the carrier (carrier) and the received signal x(t) produce the demodulation of A(t) according to the following relations:

$$\text{input } x = A(t)\cdot\cos(\omega_i t + \phi)$$

$$\text{carrier} = 2\cdot\cos(\omega_a t + \psi)$$

$$y_i = \text{input} \cdot \text{carrier}$$

$$y_i = 2\cdot A(t)\cdot\cos(\omega_i t+\phi)\cdot\cos(\omega_a t+\psi) = A(t)\cdot\cos[(\omega_i+\omega_a)t+(\phi+\psi)] + \cos[(\omega_i-\omega_a)t+(\phi-\psi)]$$

After multiplication, one obtains a frequency composed of two components, as shown in FIG. 3. One is modulated around the frequency $(\omega_i - \omega_a)$, the other one is modulated around the frequency $(\omega_i + \omega_a)$. If the higher-frequency component is removed with a low-pass filter and the condition $\omega_i = \omega_a$ is set, one obtains:

$$y = A(t)\cdot\cos[(\omega_i-\omega_a)t+(\phi-\psi)] = A(t)\cdot\cos(\phi-\psi)t = A(t)\cdot k(t)$$

$$w_i = \omega_a$$

$$|k| \leq 1$$

Since the coefficient k has a modulus of 1 or less, and to also provide the demodulated channel with the maximum energy level (SNR=max, where SNR is the signal/noise ratio), it is necessary to set:

$$\omega_a = \omega_i \Rightarrow y = A(t)\cdot\cos(\phi-\psi)$$

$$\phi = \psi \Rightarrow y = A(t)$$

Using the same reasoning and with reference to FIGS. 3 and 4, it can be easily demonstrated that it is possible to perform baseband demodulation of the transposed input channel or of its exact symmetrical counterpart by acting on the position of the frequency of the local carrier. If $f_c = f_i$, the baseband spectrum is the input spectrum, and if $f_c = f_n$; then a symmetrical spectrum is obtained.

The above is a direct demodulation. We now describe an AM demodulation achieved in two steps, i.e., with the aid of two carriers, designated by carrier$_1$ and carrier$_2$. With reference to the diagram of FIG. 2, the reference numeral 1 designates, as in the preceding case, an input filter, whereas the reference numeral 2 designates the low-pass filter and 3 is the multiplier to which the first carrier, carrier$_1$, is fed. The diagram of FIG. 2 provides for a second multiplier 4 to which the second carrier, carrier$_2$, is fed and an additional low-pass filter 5 is arranged downstream of the multiplier 4.

In this case, one has the following relations:

$$\text{input} = A(t)\cdot\cos(\omega_i t + \phi)$$

$$\text{carrier}_1 = 2\cdot\cos(\omega_a t + \psi)$$

$$\text{carrier}_2 = 2\cdot\cos(\omega_b t + \phi)$$

$$(\omega_a + \omega_b) = \omega_i$$

$$y_a = \text{input}\cdot\text{carrier}_1$$

$$y_a = 2\cdot A(t)\cdot\cos(\omega_i t+\phi)\cdot\cos(\omega_a t+\psi) = A(t)\{\cos[(\omega_i+\omega_a)t+(\phi+\psi)] + \cos[(\omega_i-\omega_a)t+(\phi-\psi)]\}$$

After eliminating the high-frequency component $(\omega_i + \omega_a)$ one obtains:

$$y_b = A(t)\cdot\cos[(\omega_i-\omega_a)t+(\phi+\psi)]$$

After the first multiplication in the first multiplier 3, the spectrum A(t) is modulated around the intermediate frequency $\omega_{int} = (\omega_i - \omega_a)$, with the initial phase $f_{int} = (\phi - \psi)$. The spectrum has been shifted to a lower frequency. With the second stage, shown in FIG. 2, one obtains:

$$y_c = y_b \cdot \text{carrier}_2$$

$$y_c = 2\cdot A(t)\cdot\cos(w_{int} t+\phi_{int})\cdot\cos(\omega_b t+\phi)$$

$$y_c = A(t)\{\cos[(w_{int}+\omega_b)t+(\phi_{int}+\phi)] + \cos[(\omega_{int}-\omega_b)t+(\phi_{int}-\phi)]\}$$

and after the low-pass filter 5

$$y = A(t)\cdot\cos[(\omega_{int}-\omega_b)t+(\phi_{int}-\phi)]$$

The conditions under which the input signal A(t) is correctly baseband-demodulated are as follows:

$$\omega_i = (\omega_a + \omega_b) \quad\quad\quad \text{condition 1}$$

$$\phi = (\psi + \phi) \quad\quad\quad \text{condition 2}$$

It can be noted that both the frequency $\omega_i$ and the phase $\phi$ can be distributed at will between the two local carriers, carrier$_1$ and carrier$_2$. Accordingly, the following problems arise in the design of a demodulator, particularly of the digital type.

Since at the output of a tuner the phase $\omega$ is not known in advance and the medium-frequency spectrum has a frequency shift which can vary by a few hundred kHz with respect to its nominal value (for a video tuner the band is 33–38.9 MHZ+/–100 kHz), the need for a PLL is evident for analog recovery signals to extract $\omega_i$ in phase with the received signal f. For medium-high frequencies (f>20 MHz), digital PLLs are typically more burdensome than analog equivalents for an equal performance, and are therefore rarely used.

Another drawback is noted with discrete-time systems where t=nTs, with T equal to the sampling period. In this case, the frequency spectrum is periodic, with a period 2p, and this can cause an unwanted aliasing effect during demodulation, as shown in FIG. 5b.

In FIG. 5a, the carrier lies at the vertex B of the input spectrum and demodulation occurs correctly. In FIG. 5b, the carrier lies in the upper part of the spectrum, at the vertex A. In this case, the first two repeats of the sampled input spectrum are demodulated, distorting the band signal. This effect is not observed in the case of analog demodulation (see FIGS. 3 and 4) and forces a two-step demodulation, as shown in FIG. 5c.

In this case, the first demodulation is meant to shift the input spectrum to a lower frequency and to shift the second demodulation to a higher frequency. With the second demodulation, the channel is brought to baseband correctly without aliasing errors, but this nearly doubles the complexity of the architecture, which uses at least two multipliers and three filters, as shown in FIG. 2.

SUMMARY OF THE INVENTION

An object of the present invention is to provide a digital AM demodulator in which recovery of the frequency and phase of the carrier is performed without resorting to a PLL.

A further object of the present invention is to provide a digital AM demodulator which can be easily integrated in digital video decoders.

Another object of the present invention is to provide a digital AM demodulator in which the complexity of the circuit and the occupied area are reduced with respect to known approaches.

Yet another object of the present invention is to provide a digital AM demodulator which is highly reliable, relatively easy to manufacture and is done so at competitive costs.

These objects and others which will become apparent hereinafter are achieved by a digital AM demodulator, particularly for demodulating a signal originating from a tuner, comprising means for generating a first carrier which is not correlated with the input signal to be demodulated, a first multiplier for multiplying the first carrier by the input signal to be demodulated, and a plurality of filters arranged upstream and downstream of the first multiplier and suitable to eliminate unwanted spectral emissions.

The digital AM demodulator further comprises means for detecting the phase shift between the frequency of the input signal to be demodulated and a local carrier, and means for correlating the first carrier with the input signal. The first carrier and the local carrier are mutually correlated, and the local carrier is not correlated with the input signal to be demodulated.

BRIEF DESCRIPTION OF THE DRAWINGS

Further characteristics and advantages of the invention will become apparent from the description of preferred but not exclusive embodiments of the demodulator according to the invention, illustrated by way of non-limiting examples in the accompanying drawings, wherein.

DETAILED DESCRIPTION OF THE PREFERRED EMBODIMENTS

Figure 1:
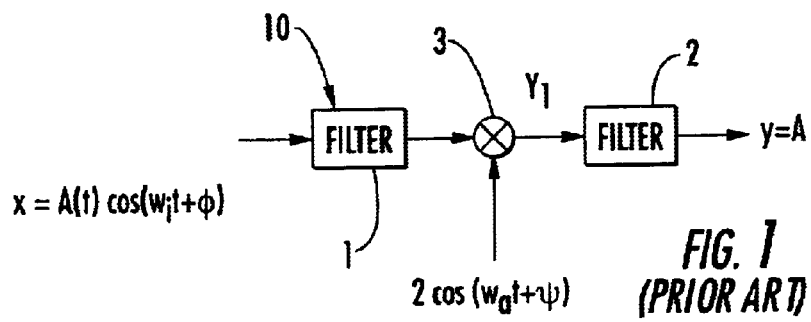
FIG. 1 is a block diagram of a direct AM demodulator circuit according to the prior art.
Figure 6:
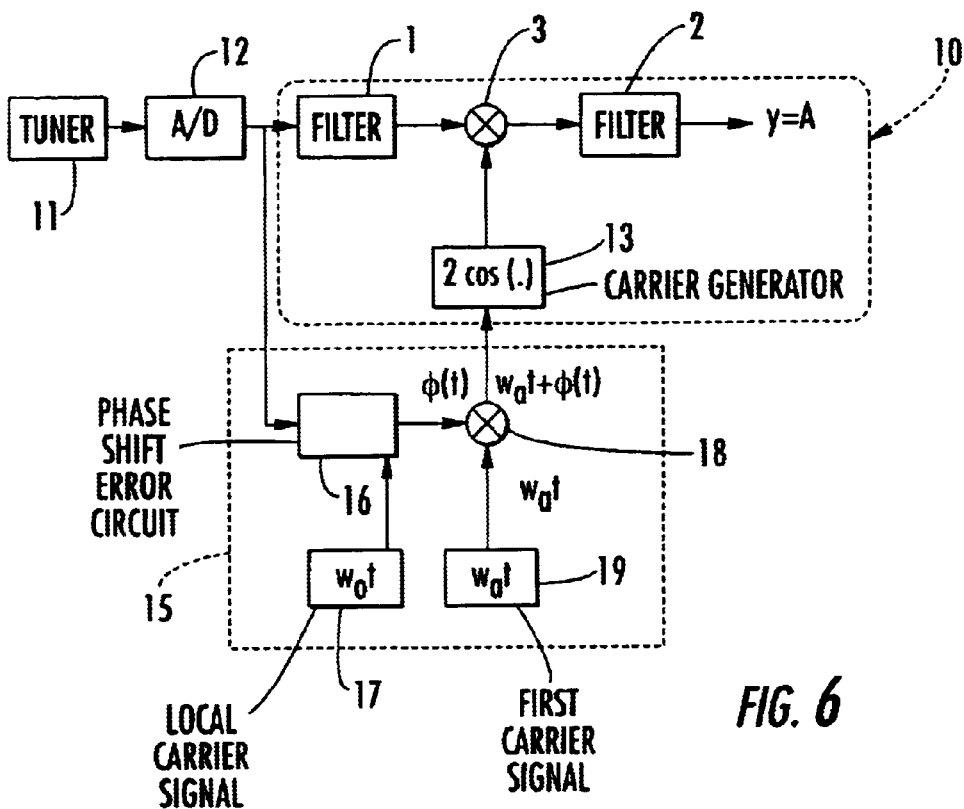
FIG. 6 is a block diagram of a one-step digital demodulator according to the present invention.

With reference to the above figures, in which identical reference numerals designate identical elements, the digital demodulator according to the present invention is shown in its first embodiment in FIG. 6, in which the block designated by the reference numeral 10 corresponds to the block designated by the reference numeral 10 shown in FIG. 1.

The signal arriving from a tuner 11 is sampled in an analog/digital converter 12 and is then fed to block 10, which comprises an input filter 1, multiplier 3, and a low-pass filter 2. In the block 10, the multiplier 3 multiplies the signal output from the low-pass filter 1 by a carrier provided by block 13. The block 10 therefore comprises at least one means for generating a carrier. The digital demodulator according to the invention further comprises means for detecting the phase shift between the frequency of an input signal x (input) which is provided from the analog/digital converter 12 and is fed to the filter 1 and a local carrier designated by $\omega_o t$.

The carrier generator 13 generates a carrier, designated by carrier$_1$, which is phase-correlated with respect to the phase $\phi$ of the signal received by the tuner 11. The local carrier generated by the local carrier generator 17 is not correlated with the carrier of the input signal x.

The means 15 for detecting the phase shift between the frequency of the input signal and the local carrier further comprise means for correlating between the local carrier $\omega_o t$ and the first carrier $\omega_a t$. In detail, the means for detecting the phase shift between the frequency of the input signal and the local carrier comprises means 16 adapted to provide at an output an estimated phase error signal $\phi(t)$ which is determined by comparing the phase of the input signal (x=input) with the phase of the local carrier $\omega_o t$.

The phase error signal $\phi(t)$ is fed to an adder 18 which provides the correlation between the first carrier $\omega_a t$ and the frequency of the input signal x. The means for generating the first carrier 19 generates the carrier $\omega_a t$, which is fed to the adder 18 along with the phase error signal $\phi(t)$. The correlated output signal of the adder 18 is sent to the carrier generator 13 for generating a phase-correlated first carrier signal. The carrier generator 13 is connected to the multiplier 3, and the adder 18 is connected to the carrier generator 13.

The block diagram of FIG. 6, which illustrates the structure of the one-step digital demodulator according to the present invention, is based on the assumption that the frequency of the local carrier $\omega_o$ is equal to the frequency $\omega_a$ of the first carrier, and that the frequency of the local carrier is proximate to the frequency $\omega_i$ of the input signal.

Figure 7:
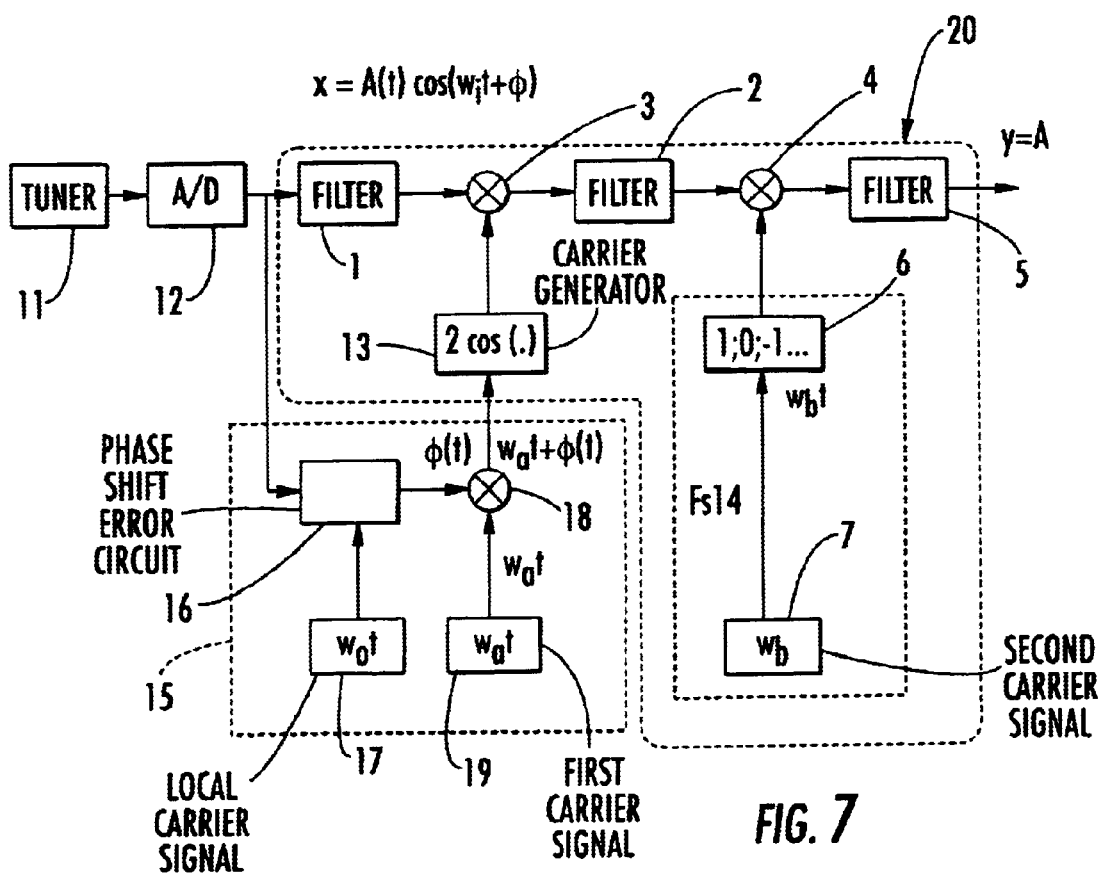
FIG. 7 is a block diagram of a two-step digital demodulator according to the present invention.
Figure 8:
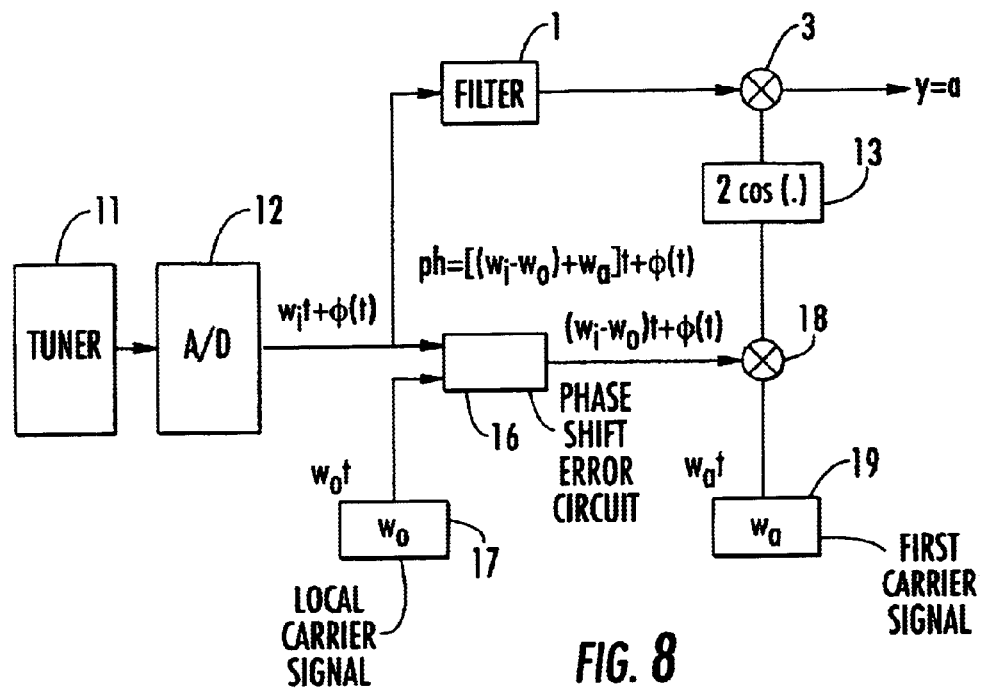
FIG. 8 is a block diagram of an equivalent phase recovery circuit used in the digital demodulator shown in FIGS. 6 and 7.

FIG. 7 illustrates a second embodiment of the digital demodulator according to the present invention, which is a two-step type. In this case it is necessary to have $\omega_o = \omega_a + \omega_b$ and $\omega_o$ must be in the neighborhood of $\omega_i$. Reference should be made again to FIG. 2, which is a block diagram of a two-step AM demodulator according to the prior art.

Figure 2:
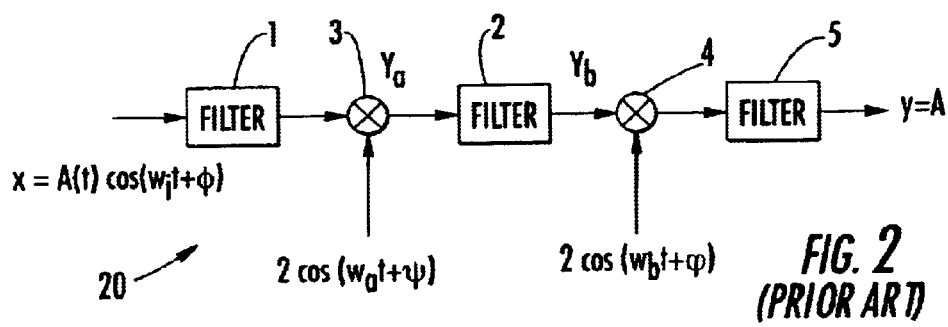
FIG. 2 is a block diagram of a two-step AM demodulator circuit according to the prior art.
Figure 3:
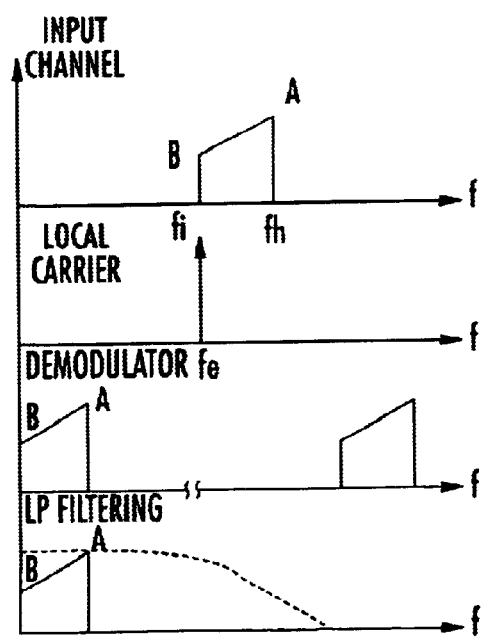
FIGS. 3 and 4 are charts which plot direct analog demodulation with the local carrier arranged respectively in two different positions according to the prior art demodulator circuits.
Figure 4:
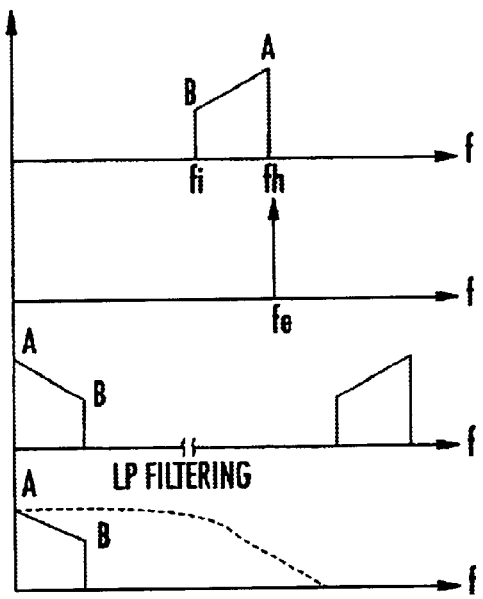
Figure 5A:
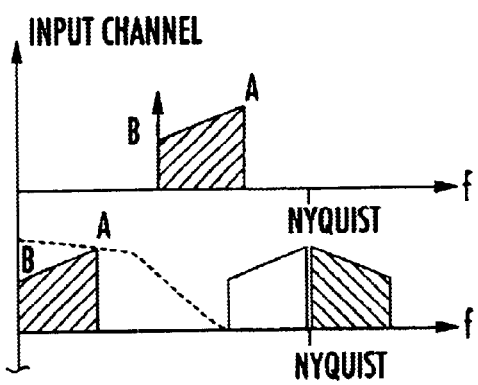
FIG. 5a is a chart which plots direct digital demodulation according to the prior art demodulator circuits.
Figure 5B:
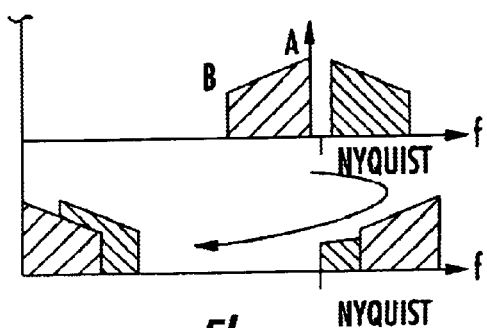
FIG. 5b is a chart which plots direct digital demodulation with aliasing according to the prior art demodulator circuits.
Figure 5C:
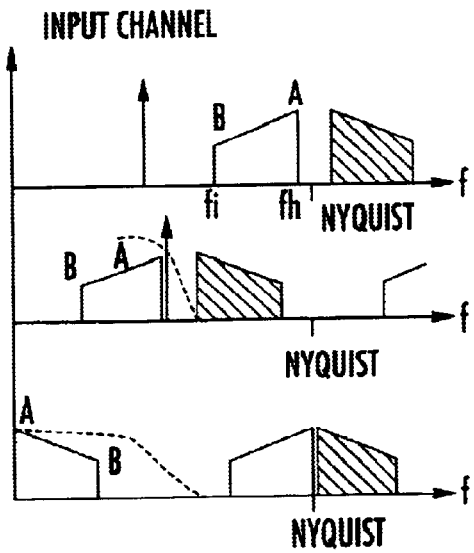
FIG. 5c is a chart which plots indirect digital demodulation without aliasing according to the prior art demodulator circuits.

The demodulator according to the invention starts from the block diagram of FIG. 2, which includes an input filter 1, a second low-pass filter 2, a first multiplier 3 interposed between the two filters, a second multiplier 4 which is cascade-connected to the low-pass filter 2 and receives as an input a second carrier, and a low-pass filter 5 which is cascade-connected to the second multiplier 4.

Therefore, the block designated by 20 in FIG. 7 substantially corresponds to the block designated by the reference numeral 20 in FIG. 2, with the differences presented hereinafter. An exception is that the block designated by the reference numeral 15 of FIG. 7 corresponds to the block designated by the reference numeral 15 in FIG. 6.

This is in addition to the two carriers, both of which are not phase-correlated with respect to the phase φ of the signal received by the tuner 11, and two multipliers 3 and 4 arranged in a cascade configuration. The particularity of the circuit of FIG. 7 is the fact that the frequency $\omega_b$ from the second carrier, generated in block 7, is set equal to the sampling frequency/4 and is correlated to the local carrier $\omega_o t$, but is not correlated with respect to the phase of the input signal.

The choice made for the frequency $\omega_b$ simplifies the hardware complexity of the second multiplier 4 to a single (N)-bit adder, as described hereinafter. The block 7, together with block 6, constitutes a numeric oscillator for generating the second carrier $\omega_b = (\omega_{sampling}/4)$. Accordingly, with reference to FIG. 7 the relations that define the signals present in the demodulator of FIG. 7 are described below.

$$\text{input} = A(t) \cdot \cos(\omega_i t + \phi)$$

$$\text{carrier}_1 = 2 \cdot \cos[(\omega_i - \omega_a)t + \phi]$$

$$\text{carrier}_2 = 2 \cdot \cos(\omega_a t)$$

$$t = n/Ts$$

$$\omega_b = (\omega_{sampling})/4 \text{ and } \omega_a = \omega_i - (\omega_{sampling})/4$$

$$y_a = \text{input} \cdot \text{carrier}_1$$

$$y = 2 \cdot A(t) \cdot \cos(\omega_i t + f) \cdot \cos[(\omega_i - \omega_a)t + \phi] = A(t)\{\cos(\omega_a t) + \cos(2 \cdot \omega_i - \omega_a)t + 2 \cdot \phi\}$$

After the first filter 1 one obtains:

$$y_b = A(t) \cdot \cos(\omega_a t)$$
$$y = 2 \cdot A(t) \cdot \cos(\omega_a t) \cdot \cos(\omega_a t)$$
$$= A(t)[\cos(2 \cdot \omega_a t) + \cos(\omega_a t - \omega_a t)]$$

Finally, after the second low-pass filter 5 one obtains:

$$y = A(t) \cdot \cos(\omega_a t - \omega_a t) = A(t)$$

As previously mentioned, the choice made for the second carrier $\omega_b$ allows simplification of the hardware complexity of the second multiplier 4, reducing them to a single N-bit adder, since:

$$\cos(\omega_b t) = \cos(2p \cdot n \cdot \omega_b/\omega_{sampling}) = \cos(n \cdot p/2) = \{1,0,-1,0,1 \ldots \}$$

whereas a full multiplier is formed by (N−1) N-bit adders.

The digital demodulator according to the invention therefore substantially comprises a section 20 formed by the cascade arrangement of a full multiplier (first multiplier 3), a simplified multiplier (second multiplier 4), a numeric oscillator 6, 7 for generating the second carrier $\omega_b = (\omega_{sampling})/4$ and the appropriate filters 1, 2 and 5 to eliminate the unwanted spectral emissions as mentioned earlier. The second section, designated by the reference numeral 15, is instead formed by a system for generating the first carrier $\omega_a$ and the recovery of the phase φ of the spectrum of the received signal without the aid of a PLL which causes integration and cost problems.

Figure 9:
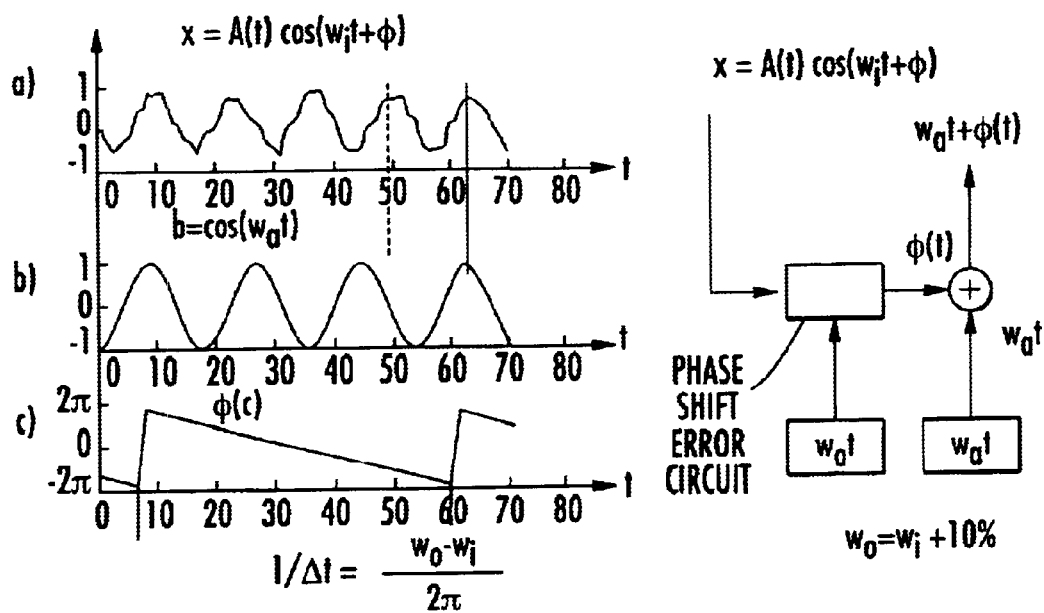
FIG. 9 is a chart which plots the signals that contribute to the determination of the correction phase in the digital demodulator according to the present invention.

FIG. 9 illustrates the equivalent phase recovery circuit, which takes into account any jittering of the tuner 11. It is assumed initially that the local carrier $\omega_o t$ coincides with the carrier $\omega_i t$ of the tuner 11. In this case, block 16 returns as an output the estimated phase error φ. If this value is added to the first carrier $\omega_a t$, which is not correlated with the input, one obtains $$\omega_a t + \phi = (\omega_i - \omega_a/4)t + \phi.$$

This is the frequency of the first carrier that was to be obtained. We now analyze the case in which the carrier at the output of the tuner 11 varies with respect to its nominal value (jitter):

$$\omega_i = (\omega_i + \Delta\omega)t$$

The final frequency is:

$$ph = [(\omega_i - \omega_o) + \omega_a]t + \phi$$

and once again the second term is the phase shift to be obtained. The first term is $$\omega = d[(\omega_i - \omega_o) + \omega_a]t/dt$$
$$= (\omega_i - \omega_o) + \omega_a$$
$$= \Delta\omega + \omega_a$$

The frequency of the first carrier is corrected with the term Δω in order to compensate for the variation of the tuner 11. FIG. 9 illustrates, by way of example, the situation that occurs if $\omega_i$ and $\omega_o$ differ by 10%. Chart (a) shows the received signal, which is amplitude-modulated with the transmitted carrier. Chart (b) plots the local carrier $\omega_o$, whose frequency is smaller than $\omega_i$ and chart (c) plots the frequency f(t) for carrier recovery. It should be noted that 1/Δt is Δω/2p, i.e., the correction of the frequency to be applied.

The demodulator according to the invention therefore proposes two alternative structures for the single-step and two-step digital modulators. The alternative structures are efficient in terms of complexity, i.e., reduced occupied area, and which, with an appropriate distribution of the involved parameters, allows structurally simple blocks which are not affected by the typical drawbacks of an integrated PLL, e.g., rounding and quantization error.

In practice it has been observed that the demodulator according to the present invention fully achieves the intended aim and objects, in which carrier phase and frequency recovery are performed without resorting to a PLL. This avoids locking problems, systematic offset integration errors, and errors in truncation of the internal calculations.

The demodulator according to the invention provides a digital system with a data processing section and a medium-frequency receiver section that is connected to the output of the cable, antenna or dish tuner, according to the particular situation. The demodulator, when used with a TV, can also be used for any TV standard. The demodulator thus conceived is susceptible to numerous modifications and variations, all of which are within the scope of the inventive concept. All the details enclosed herein may also be replaced with other technically equivalent elements.

That which is claimed is:

1. A digital AM demodulator for demodulating an input signal comprising:
    a first generator for generating a phase-correlated first carrier signal based upon a correlated signal;
    a first multiplier for multiplying the phase-correlated first carrier signal and the input signal;
    first and second filters respectively arranged upstream and downstream of said first multiplier for filtering undesired signals;
    a phase shift detection circuit for detecting a phase shift between the input signal and a local carrier signal not correlated with the input signal but is correlated with a first carrier signal; and
    a correlator for correlating the first carrier signal with the input signal based upon the detected phase shift for providing the correlated signal to said first generator.

2. A digital AM demodulator according to claim 1, wherein the detected phase shift and the generated phase-correlated first carrier signal are implemented without using a phase locked loop (PLL).

3. A digital AM demodulator according to claim 1 further comprising:
    a second generator for generating a second carrier signal; and
    a second multiplier for multiplying the second carrier signal and a signal produced by said first multiplier.

4. A digital AM demodulator according to claim 1 further comprising:
    a local generator for generating the local carrier signal; and
    wherein said phase shift detection circuit comprises a comparator for determining a phase error between the input signal and the local carrier signal.

5. A digital AM demodulator according to claim 4 wherein said correlator comprises an adder for adding the phase error to the first carrier signal so that the correlated signal is a summed signal.

6. A digital AM demodulator according to claim 1 wherein a frequency of the local carrier signal is equal to a frequency of the first carrier signal.

7. A digital AM demodulator according to claim 6, wherein the frequency of the local carrier signal is close to a frequency of the input signal.

8. A digital AM demodulator according to claim 1 wherein said first multiplier comprises a full multiplier.

9. A digital AM demodulator according to claim 3 wherein the second carrier signal has a frequency that is one quarter a frequency of a sampling signal.

10. A digital AM demodulator according to claim 9 wherein said second multiplier comprises an N-bit adder.

11. A digital AM demodulator according to claim 3 wherein said second generator comprise a numeric oscillator.

12. A digital AM demodulator according to claim 9 wherein a frequency of the first carrier signal is equal to a difference between a frequency of the input signal and the frequency of the second carrier signal.

13. A digital AM demodulator according to claim 3, further comprising a third filter arranged downstream of said second multiplier.

14. A digital AM demodulator comprising:
    a first generator for generating a phase-correlated first carrier signal based upon a correlated signal;
    a first multiplier for multiplying the phase-correlated first carrier signal and an input signal;
    a local generator for generating a local carrier signal not correlated with the input signal but is correlated with a first carrier signal;
    a phase shift detection circuit for detecting a phase shift between the input signal and a local carrier signal;
    a correlator for correlating the first carrier signal with the input signal based upon the detected phase shift for providing the correlated signal to said first generator; and
    the detected phase shift and the generated phase-correlated first carrier signal being implemented without using a phase locked loop (PLL).

15. A digital AM demodulator according to claim 14 further comprising first and second filters respectively arranged upstream and downstream of said first multiplier for filtering undesired signals.

16. A digital AM demodulator according to claim 14 further comprising:
    a second generator for generating a second carrier signal; and
    a second multiplier for multiplying the second carrier signal and a signal produced by said first multiplier.

17. A digital AM demodulator according to claim 14 wherein said phase shift detection circuit comprises a comparator for determining a phase error between the input signal and the local carrier signal.

18. A digital AM demodulator according to claim 17 wherein said correlator comprises an adder for adding the phase error to the first carrier signal so that the correlated signal is a summed signal.

19. A digital AM demodulator according to claim 14 wherein a frequency of the local carrier signal is equal to a frequency of the first carrier signal.

20. A digital AM demodulator according to claim 19, wherein the frequency of the local carrier signal is close to a frequency of the input signal.

21. A digital AM demodulator according to claim 14 wherein said first multiplier comprises a full multiplier.

22. A digital AM demodulator according to claim 16 wherein the second carrier signal has a frequency that is one quarter a frequency of a sampling signal.

23. A digital AM demodulator according to claim 22 wherein said second multiplier comprises an N-bit adder.

24. A digital AM demodulator according to claim 16 wherein said second generator comprise a numeric oscillator.

25. A digital AM demodulator according to claim 22 wherein a frequency of the first carrier signal is equal to a difference between a frequency of the input signal and the frequency of the second carrier signal.

26. A digital AM demodulator according to claim 16 further comprising a third filter arranged downstream of said second multiplier.

27. A television receiver comprising:
a tuner outputting an input signal to be demodulated;
an analog/digital converter connected to an output of said tuner; and
a digital AM demodulator connected to an output of said analog/digital converter, said demodulator comprising
a first generator for generating a phase-correlated first carrier signal based upon a correlated signal,
a first multiplier for multiplying the phase-correlated first carrier signal and the input signal,
first and second filters respectively arranged upstream and downstream of said first multiplier for filtering undesired signals,
a phase shift detection circuit for detecting a phase shift between the input signal and a local carrier signal not correlated with the input signal but is correlated with a first carrier signal, and
a correlator for correlating the first carrier signal with the input signal based upon the detected phase shift for providing the correlated signal to said first generator.

28. A television receiver according to claim 27, wherein the detected phase shift and the generated phase-correlated first carrier signal are implemented without using a phase locked loop (PLL).

29. A television receiver according to claim 27 further comprising:
a second generator for generating a second carrier signal; and
a second multiplier for multiplying the second carrier signal and a signal produced by said first multiplier.

30. A television receiver according to claim 27 further comprising:
a local generator for generating the local carrier signal; and
wherein said phase shift detection circuit comprises a comparator for determining a phase error between the input signal and the local carrier signal.

31. A television receiver according to claim 30 wherein said correlator comprises an adder for adding the phase error to the first carrier signal so that the correlated signal is a summed signal.

32. A television receiver according to claim 27 wherein a frequency of the local carrier signal is equal to a frequency of the first carrier signal.

33. A television receiver according to claim 32, wherein the frequency of the local carrier signal is close to a frequency of the input signal.

34. A television receiver according to claim 27 wherein said first multiplier comprises a full multiplier.

35. A television receiver according to claim 29 wherein the second carrier signal has a frequency that is one quarter a frequency of a sampling signal.

36. A television receiver according to claim 35 wherein said second multiplier comprises an N-bit adder.

37. A television receiver according to claim 29 wherein said second generator comprise a numeric oscillator.

38. A television receiver according to claim 35 wherein a frequency of the first carrier signal is equal to a difference between a frequency of the input signal and the frequency of the second carrier signal.

39. A television receiver according to claim 29, further comprising a third filter arranged downstream of said second multiplier.

40. A method for demodulating a digital AM input signal comprising:
generating a phase-correlated first carrier signal based upon a correlated signal;
multiplying the input signal and the phase-correlated first carrier signal to produce a first multiplied signal;
filtering the first multiplied signal;
generating a local carrier signal not correlated with the input signal but is correlated with the a first carrier signal;
determining a phase shift between a frequency of the input signal and a frequency of the local carrier signal; and
correlating a frequency of the first carrier signal with the frequency of the input signal based upon the phase shift for providing the correlated signal.

41. A method according to claim 40, wherein determining the phase shift and generating the phase-correlated first carrier signal are implemented without using a phase locked loop (PLL).

42. A method according to claim 40, further comprising filtering the input signal.

43. A method according to claim 40, further comprising:
generating a second carrier signal; and
multiplying the second carrier signal and the first multiplied signal.

44. A method according to claim 40 wherein correlating comprises adding the phase error signal to the first carrier signal.

45. A method according to claim 40, wherein the frequency of the local carrier signal is close to the frequency of the input signal, and is equal to the frequency of the first carrier signal.

46. A method according to claim 43 wherein a frequency of the second carrier signal is equal to one quarter a frequency of a sampling signal for the input signal, and the frequency of the first carrier signal is equal to a difference between the frequency of the input signal and the frequency of the second carrier signal.

* * * * *

UNITED STATES PATENT AND TRADEMARK OFFICE
CERTIFICATE OF CORRECTION

PATENT NO. : 6,748,028 B1
DATED : June 8, 2004
INVENTOR(S) : Luigi Della Torre, Marco Ronchi and Andrea Vitali It is certified that error appears in the above-identified patent and that said Letters Patent is hereby corrected as shown below:

<u>Column 5,</u>
Line 56, delete "$y = 2 \cdot A(t) \cdot cos(\omega_i t + f) \cdot cos[(\omega_i - \omega_a)t + \varphi]$" insert
-- $y_a = 2 \cdot A(t) \cdot cos(\omega_i t + f) \cdot cos[(\omega_i - \omega_a)t + \varphi]$ --

Signed and Sealed this

Twenty-third Day of November, 2004

JON W. DUDAS
*Director of the United States Patent and Trademark Office*